(12) United States Patent
Takagi

(10) Patent No.: US 7,288,958 B2
(45) Date of Patent: Oct. 30, 2007

(54) SLEW RATE CALIBRATING CIRCUIT AND SLEW RATE CALIBRATING METHOD

(75) Inventor: Takuya Takagi, Tokyo (JP)

(73) Assignee: NEC Corporation, Tokyo (JP)

( * ) Notice: Subject to any disclaimer, the term of this patent is extended or adjusted under 35 U.S.C. 154(b) by 62 days.

(21) Appl. No.: 11/362,819

(22) Filed: Feb. 28, 2006

(65) Prior Publication Data

US 2006/0197568 A1    Sep. 7, 2006

(30) Foreign Application Priority Data

Mar. 1, 2005    (JP)    ............................. 2005-056472

(51) Int. Cl.
*H03K 3/017*    (2006.01)
*H03K 5/12*    (2006.01)
*H03K 5/02*    (2006.01)
*H03K 17/16*    (2006.01)

(52) U.S. Cl. .................. 326/26; 327/172; 327/170; 327/178; 326/27

(58) Field of Classification Search ............ 326/26–27, 326/86, 108
See application file for complete search history.

(56) References Cited

U.S. PATENT DOCUMENTS 7,109,768 B2 *    9/2006    Rashid ........................ 327/170

2005/0285648 A1*    12/2005    Wilson et al. ............... 327/172
2007/0001725 A1*    1/2007    Atha et al. ................... 327/172

FOREIGN PATENT DOCUMENTS

JP    2000-174594 A    6/2000
JP    2002-26712 A    1/2002

* cited by examiner

*Primary Examiner*—Rexford Barnie
*Assistant Examiner*—Thienvu Tran
(74) *Attorney, Agent, or Firm*—Sughrue Mion Pllc.

(57) ABSTRACT

A slew rate calibrating circuit and a slew rate calibrating method are provided which are capable of adjusting, with high accuracy, a slew rate of a signal to be output to a transmission path. A first clock is input and a delay time of a variable delay circuit is increased or decreased so that a phase of the first clock coincides with a phase of a first differential buffer output signal which rises when a voltage of a transmission path outgoing signal is at the same level as a first reference voltage or exceeds the first reference voltage. Then, a second clock is input and a slew rate of an output buffer is increased or decreased so that a phase of the second clock coincides with a phase of a second differential buffer output signal which rises when a voltage of a transmission path output signal is at the same level as a second reference voltage or exceeds the second reference voltage.

13 Claims, 11 Drawing Sheets

(Slew Rate Calibration Control Processing to be Performed by Slew Rate Calibration Controlling Section)

SLEW RATE CALIBRATING CIRCUIT AND SLEW RATE CALIBRATING METHOD

BACKGROUND OF THE INVENTION

1. Field of the Invention

The present invention relates to a slew rate calibrating circuit and a slew rate calibrating method to adjust a slew rate being a maximum change rate of a voltage of a signal to be output, at high speed, from circuits such as a semiconductor device and more particularly to the slew rate calibrating circuit and slew rate calibrating method suitably used to adjust the slew rate to become its desired value.

The present application claims priority of Japanese Patent Application No. 2005-056472 filed on Mar. 1, 2005, which is hereby incorporated by reference.

2. Description of the Related Art

For example, when a rectangular pulse signal represented by a binary number of a "0" or a "1" is output, at high speed, from an output buffer of an LSI (Large Scale Integrated circuit) to a transmission path connected to the LSI, noises occur, in some cases, due to reflections of a signal or a like occurring when the signal is input to a rear-stage circuit. Such noise causes a malfunction of the rear-stage circuit. To solve this problem, calibration of a slew rate is generally performed to suppress a steep rise or fall of a waveform of a pulse signal. Here, a slew rate denotes an absolute value of a voltage change rate of a signal which is represented by a voltage that can increase per unit time.

A slew rate of a signal to be sent out, at high speed, to a transmission path has a proper range of a value. For example, if a slew rate is made excessively small, a voltage change of a signal is very slow and, as a result, a delay time occurring before a voltage of the signal reaches a specified voltage becomes longer. If a slew rate is made excessively large, a response to a voltage change is excellent, however, as described above, the excessively large slew rate causes occurrence of noises.

To solve this problem, a slew rate calibrating circuit is conventionally proposed (first conventional technology) which is so configured as to adjust a slew rate to become its proper value determined empirically depending on a length of a transmission path or a state of a signal to be output to the transmission path (see Japanese Patent Application Laid-open No. 2002-26712, 0019-th paragraph, FIGS. 3 and 6 (Patent Reference 1)). In the above Patent Reference 1, an output buffer to output a signal to a transmission path is used to adjust a slew rate. Then, a simulation is performed on correlation between a parameter to be used for the slew rate calibration and a slew rate to identify a value of the parameter. This enables the slew rate to be adjusted to become its target value.

However, ordinarily, the correlation between a slew rate and a parameter differs slightly depending on a factor of a difference in configurations of an output buffer to be applied or a difference in use environments. Therefore, the technology disclosed in the above Patent Reference 1 has a problem in that a slew rate cannot be adjusted with high accuracy.

To solve this problem, a method is considered to be available in which a slew rate is made to coincide with its target value by calculating a maximum voltage value to be changed in a unit time of a signal to be output from an output buffer and by changing a parameter until an amount of the change coincides with a calculated value. However, it is necessary that the unit time to be employed in the above operations is set to be shorter than, at least, one cycle period in a transfer frequency, and the higher the target value of a slew rate is, the shorter the unit time becomes.

As a method for accurately measuring a very short unit time, a second conventional technology is disclosed (see, for example, Japanese Patent Application Laid-open No. 174594, 0046-th paragraph, FIG. 4 (Patent Reference 2)) in which two clocks each having a different frequency are used. In the above Patent Reference 2, a first clock having a first period and a second clock having a second period extended by a specified time than the first period are prepared and the first clock is first input through a variable delay circuit to a specified device. Then, a delay time of the variable delay circuit is set so that a delay time of a clock output from the device relative to the original first clock comes near the first period. That is, a sum total of the delay time occurring between an input side of the variable delay circuit and an output side of the device is made to coincide with a first period. With a state of the above coincidence, a clock to be input to the specified device through the variable delay circuit is switched to select the second clock. This causes the delay time of the clock to be output from the device relative to the second clock to be made equal to the first period. That is, a difference in phase between the clock to be output from the device and the original second clock becomes equal to the above-described specified time. Thus, it is made possible to measure, with high accuracy, a very short unit time to be used as a reference when a slew rate is made to coincide with its target value.

However, according to the above second conventional technology, in order to make a slew rate of a signal output from the output buffer to a transmission path come near its target value, not only detection of an amount of a change in a voltage within the measured unit time but also measurement of a unit time in a period of time during which the amount of the change of a voltage value takes on a maximum value is required. As described above, the unit time for setting a slew rate is very short and it is almost impossible for a user to properly choose the starting and terminating timing.

SUMMARY OF THE INVENTION

In view of the above, it is an object of the present invention to provide a slew rate calibrating circuit and slew rate calibrating method which are capable of, with high accuracy, adjusting a slew rate of a signal to be output to a transmission path.

According to a first aspect of the present invention, there is provided a slew rate calibrating circuit including:

a signal processing unit to output an input signal in a manner in which restrictions are put on a change rate of a voltage of the input signal and to be able to adjust a slew rate as a maximum change rate of a voltage of the output signal;

a variable signal delaying unit being connected to an input side of the signal processing unit and to be able to adjust a delay time of a signal to be input to the signal processing unit;

a clock selecting unit to select either of a first clock or a second clock having a period extended by a predetermined unit time than that of the first clock and to supply the selected clock to the variable signal delaying unit;

a first rectangular signal outputting unit to receive a signal to be output from the signal processing unit and to invert logic of the signal every time a high-low relationship between a voltage of the signal to be output from the signal processing unit and a first predetermined reference voltage is reversed and to output a first rectangular signal having a rectangular waveform;

a delay time setting unit to compare, in a time section during which the clock selecting unit selects the first clock, a first time lag, one by one, between a rising edge or falling edge of a waveform of the first clock and a rising edge or falling edge of the first rectangular signal to be output from the first rectangular signal outputting unit in a manner to respond to a corresponding rising edge or falling edge of another first clock existing one period before the rising edge or falling edge of the waveform of the first clock and to set a specified delay time to the variable signal delaying unit, the specified delay time being capable of canceling out the first time lag;

a second rectangular signal outputting unit to receive a signal to be output from the signal processing unit and to invert logic of the signal every time a high-low relationship between a voltage of the signal to be output from the signal processing unit and a second predetermined reference voltage being different from that of the first reference voltage is reversed and to output a second rectangular signal; and a slew rate setting unit to compare, in a time section during which the clock selecting unit selects the second clock, a second time lag, one by one, between a rising edge or falling edge of the second clock and a rising edge or falling edge of the second rectangular signal to be output from the second rectangular signal outputting unit in a manner to respond to a corresponding rising edge or falling edge of another second clock existing one period before rising edge or falling edge of the second clock and to set a specified slew rate to the signal processing unit, such that the second time lag disappears.

In the foregoing, a preferable mode is one wherein the delay time setting unit includes:

a first count value holding unit to hold a first count value to be used to set the specified delay time to the variable signal delaying unit;

a first signal comparing unit to detect, in a time section during which the clock selecting unit selects the first clock, a direction of the first time lag, one by one, between the rising edge or falling edge of the first clock and the rising edge or falling edge of the first rectangular signal to be output from the first rectangular signal outputting unit in a manner to respond to the corresponding rising edge or falling edge of the other first clock existing one period before the rising edge or falling edge of the first clock;

a first count value increasing/decreasing unit to increase or decrease, by every one count, a first count value held by the first count value holding unit, every time the first signal comparing unit detects a direction of the first time lag, according to the direction of the first time lag; and a delay time adjusting unit to adjust the specified delay time set by the variable signal delaying unit so that the specified delay time has a length corresponding to a first count value held by the first count value holding unit.

Also, a preferable mode is one wherein the slew rate setting unit includes:

a second count value holding unit to hold a second count value to be used to set a slew rate to the signal processing unit;

a second signal comparing unit to detect, in a time section during which the clock selecting unit selects the first clock, a direction of the second time lag, one by one, between the rising edge or falling edge of the second clock and the rising edge or falling edge of the second rectangular signal to be output from the second rectangular signal outputting unit in a manner to respond to the corresponding rising edge or falling edge of the other second clock existing one period before the rising edge or falling edge of the second clock;

a second count value increasing/decreasing unit to increase or decrease, by every one count, a first count value held by the first count value holding unit, every time the second signal comparing unit detects the direction of the second time lag, according to the direction of the second time lag; and a slew rate adjusting unit to adjust a slew rate set by the signal processing unit so that the slew rate has a value corresponding to a second count value held by the second count value holding unit.

Also, a preferable mode is one that wherein includes a period difference setting unit to arbitrarily set the unit time being a difference in period between the first clock and the second clock.

Also, a preferable mode is one that wherein includes:

a first clock generating unit to generate a clock having a predetermined period; and a second clock generating unit to receive a clock generated by the first clock generating unit and to convert the input clock into a clock having an arbitrary period;

wherein the first clock is one out of two signals to be output from the first generating unit and the second generating unit, which has a shorter period, and the second clock is another one out of two signals.

Also, a preferable mode is one that wherein further includes:

a calibration start request accepting unit to accept a request asking the signal processing unit to start calibration of a slew rate;

a first clock supply instructing unit to make the clock selecting unit start supplying of the first clock to the signal processing unit when the calibration start request accepting unit accepts the request for a start of the calibration;

a second clock supply instructing unit to make the clock selecting unit switch selection of the clock to the first clock when the delay time setting unit starts setting of the first time lag and a first predetermined time elapses; and a device disconnecting unit to stop both supply of a clock to the signal processing unit and acquisition of a signal to be output from the signal processing unit when the slew rate setting unit starts setting of the slew rate and a second predetermined time elapses.

According to a second aspect of the present invention, there is provided a slew rate calibrating method including:

a first clock supply starting step to start supplying of a first clock to a signal processing unit which outputs an input signal in a manner in which restrictions are put on a change rate of a voltage of the first clock and is able to adjust a slew rate as a maximum change rate of a voltage of the output signal through a variable delaying unit which adjusts a specified delay time of a signal to be input to the signal processing unit so that the specified delay time is made variable;

a first rectangular signal outputting step to invert logic of a signal every time a high-low relationship between a voltage of a signal to be output from the signal processing unit and a first predetermined first reference voltage is reversed when the supplying of the first clock to the signal processing unit is started in the first clock supply starting step and to output a first rectangular signal having a rectangular waveform;

a first signal comparing step to detect a direction of a first time lag, one by one, between a rising edge or falling edge of a waveform of the first clock and a rising edge or falling edge of the first rectangular signal to be output from the first rectangular signal outputting unit in a manner to respond to a corresponding rising edge or falling edge of another first clock existing one period before the rising edge or falling edge of the waveform of the first clock;

a delay time setting step to increase the specified delay time set by the variable delaying unit when a lead in the rising edge or falling edge of the first rectangular signal is detected in the first signal comparing step and to decrease the specified delay time set by the variable delaying unit when a lag in the rising edge or falling edge of the first rectangular signal is detected in the first signal comparing step and to make the rising edge or falling edge of the waveform of the first clock and the rising edge or falling edge of the first rectangular signal coincide with each other;

a delay time fixing step to fix, when the rising edge or falling edge of the waveform of the first clock and the rising edge or falling edge of the first rectangular signal are made to coincide with each other in the specified delay time setting step, the specified delay time set by the variable delaying unit occurring at time of the coincidence is fixed;

a second clock supplying step to start, when the specified delay time set by the variable delaying unit is fixed in the delay time fixing step, supplying of a second clock having a period being longer by a predetermined unit time than that of the first clock, instead of the first clock, through the variable delaying unit to the signal processing unit;

a second rectangular signal outputting step to invert, when supplying of the first clock to the signal processing unit is started in the second clock supplying step, logic of a signal every time a high-low relationship between a voltage of a signal to be output from the signal processing unit and a second predetermined reference voltage being different from the first reference voltage is reversed when the supplying of the first clock to the signal processing unit is started in the first clock supply starting step and to output a second rectangular signal;

a second signal comparing step to detect a direction of a second time lag, one by one, between a rising edge or falling edge of the second clock and a rising edge or falling edge of the second rectangular signal to be output in the second signal comparing step in a manner to respond to a corresponding rising edge or falling edge of another second clock existing one period before the rising edge or falling edge of the waveform of the second clock;

a slew rate setting step to decrease the slew rate set by the signal processing unit when a lead in the rising edge or falling edge of the second rectangular signal is detected in the second signal comparing step, and to increase the slew rate set by the signal processing unit when a lag in the rising edge or falling edge of the second rectangular signal is detected in the second signal comparing step and to make the rising edge or falling edge of the second clock and the rising edge or falling edge of the second rectangular signal coincide with each other; and a slew rate fixing step to fix, when the rising edge or falling edge of the second clock and the rising edge or falling edge of the second rectangular signal are made to coincide with each other in the slew rate setting step, the slew rate occurring at the time of the coincidence is fixed.

With the above configurations, a slew rate of the signal processing unit is calibrated by switching the selection of two clocks each having a different period for being input and by transferring a selected clock to the signal processing unit whose slew rate needs to be adjusted and by making the time required for a voltage of a signal to be output from an output side of the signal processing unit to be changed by predetermined magnitude coincide with a difference in a period of the signal. This enables a slew rate of a signal to be output from the signal processing unit to coincide with its desired value with high accuracy and reliability.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

Embodiment

Figure 1:
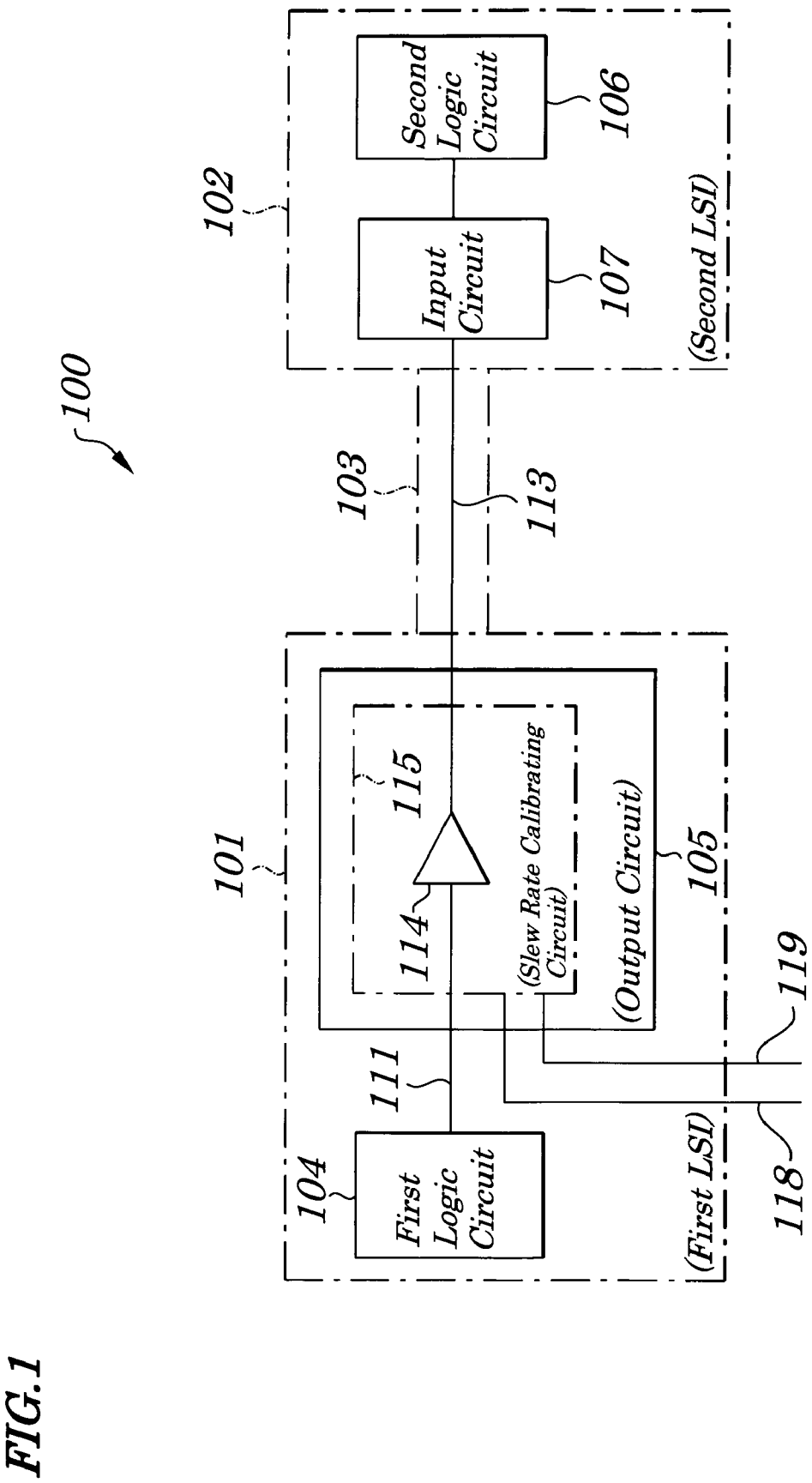
FIG. 1 is a schematic block diagram showing configurations of an information processing device using a slew rate calibrating circuit according to an embodiment of the present invention.

FIG. 1 is a schematic block diagram showing configurations of an information processing device 100 using a slew rate calibrating circuit of the embodiment of the present invention. The information processing device 100 includes a first LSI 101 serving as the LSI to transmit data, a second LSI 102 to receive data, and a transmission path 103 to transfer data sent out from the first LSI 101 to the second LSI 102.

The first LSI 101, as shown in FIG. 1, has a first logic circuit 104 to perform various arithmetic operations and an output circuit 105 to output a signal to the transmission path 103. The second LSI 102 has a second logic circuit 106 to perform various arithmetic operations and an input circuit 107 to input a signal transferred from the transmission path 103. The output circuit 105 in the first LSI 101 has an output buffer 114 to output a data signal 111 being a binary logical signal to be output from the first logic circuit 104 as a transmission path outgoing signal 113 to the transmission path 103. The output buffer 114, together with other circuit components (not shown), makes up a slew rate calibrating circuit 115. To the slew rate calibrating circuit 115 are fed a first clock 118 and a second clock 119 from a clock generating source (not shown). The first and second clocks have periods each being different by a length of a unit time (described later) from each other. Moreover, magnitude of a slew rate of the output buffer 114 is variable and can be increased or decreased by changing a value of a specified parameter.

In the configurations of the slew rate calibrating circuit 115 as shown in the embodiment, it is known empirically that, by setting a slew rate of the output buffer 114 so that, generally, time being about one-third or one-fourth of time during which a signal is transferred through a transmission path 103 is made to be time required for a signal to rise, noises can be suppressed effectively. In the embodiment, a length of the transmission path 103 is set to be 20 cm and time required for the transmission path outgoing signal 113 to be transferred through 1 cm (centimeter) of the transmission path 103 is set to be 70 ps (pico-seconds). Also, in the embodiment, a "Low" value of the transmission path outgoing signal 113 is 0.3V (volts) and its "High" value is 1.2V. In the case of the above example, time required for the transmission path outgoing signal 113 to be transferred through the transmission path 103 from the first LSI 101 to the second LSI 102 is 1400 ps and, therefore, one-fourth of the required time is 350 ps. Thus, a target value of the slew rate is 2.57V/ns (nanoseconds) which is obtained by dividing 0.9V being a result from subtraction of 0.3V from 1.2V, by 350 ps.

Figure 2:
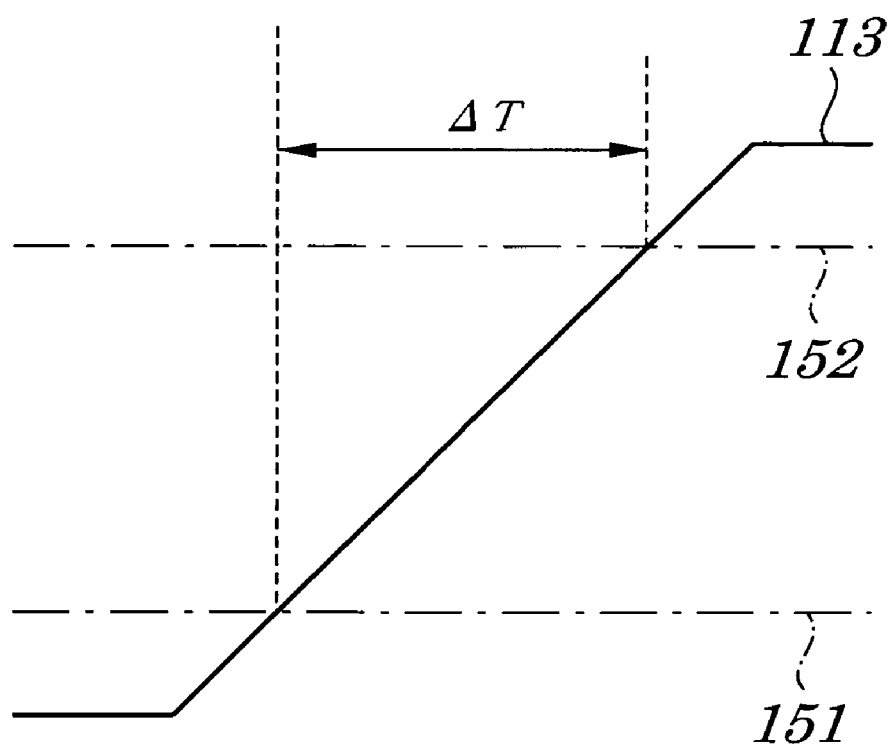
FIG. 2 is a diagram explaining a target value of a slew rate of an output buffer and principles of slew rate calibration according to the embodiment of the present invention.

FIG. 2 is a diagram explaining a target value of a slew rate of the output buffer 114 and principles of operations of slew rate calibration. As shown in FIG. 2, it is here presumed that a slew rate to be achieved when a voltage of the transmission path outgoing signal 113 is changed in a unit time between a first reference voltage 151 and a second reference voltage 152 being higher than the first reference voltage 151 is set as its target value. In this case, the first reference voltage 151 is set to be 0.5V and the second reference voltage 152 is set to be 1.0V. It is also presumed that the voltage of the transmission path outgoing signal 113 increases in proportion to time almost all over its rising section. Since the target value of the slew rate is 2.57V/ns as described above, a unit time $\Delta T$ is 195 ps.

In order to set the unit time $\Delta T$ with high accuracy, in the embodiment, two types of clocks are provided, one being the first clock 118 having a period $T_1$ and the other being the second clock 119 having a period longer by a length of the unit time $(T_1+\Delta T)$ than that of the first clock 118. First, the first clock 118 is supplied to the output buffer 114 and a signal entering an input port (not shown) of the output buffer 114 is delayed so that a delay in the time required for the transmission path outgoing signal 113 to reach the first reference voltage 151 coincides with the period $T_1$. Next, the second clock 119 is supplied to the output buffer 114 and magnitude of the slew rate of the output buffer 114, that is, of the transmission path outgoing signal 113 is adjusted so that a delay in the time required for the transmission path outgoing signal 113 to reach the second reference voltage 152 coincides with a period $(T_1+\Delta T)$. A delay in the time required for the transmission path outgoing signal 113 to reach the first reference voltage 151 is almost the same as in the case of the supply of the second clock 119. Therefore, by making the delay time coincide with the period $(T_1+\Delta T)$, a change in a voltage of the signal between the first reference voltage 151 and the second reference voltage 152 occurs in the unit time $\Delta T$, which enables the calibration of the slew rate of the output buffer 114 so that the slew rate becomes its target value.

The slew rate calibrating circuit 115 has a circuit (not shown) to delay a signal entering the output buffer 114, to adjust a delay time, and to make a period of time between time of rising of the original first clock 118 and time required for the transmission path outgoing signal 113 to reach the first reference voltage 151 coincide with the period $T_1$. Moreover, the slew rate calibrating circuit 115 also has a circuit (not shown) to adjust a slew rate of the output buffer 114, and to make a period of time between time of rising of the original second clock 119 and time required for the transmission path outgoing signal 113 to reach the second reference voltage 152 coincide with the period $(T_1+\Delta T)$. Then, by alternately performing an operation in a mode (herein called a "delay time adjusting mode") of adjusting a delay time of a signal entering the input port of the output butter 114 and an operation in a mode (herein called a "slew rate adjusting mode") of adjusting a slew rate of the output buffer 114, a slew rate is made to come near to a target value. Configurations of circuits of the slew rate adjusting circuit 115 as above are described in detail.

Figure 3:
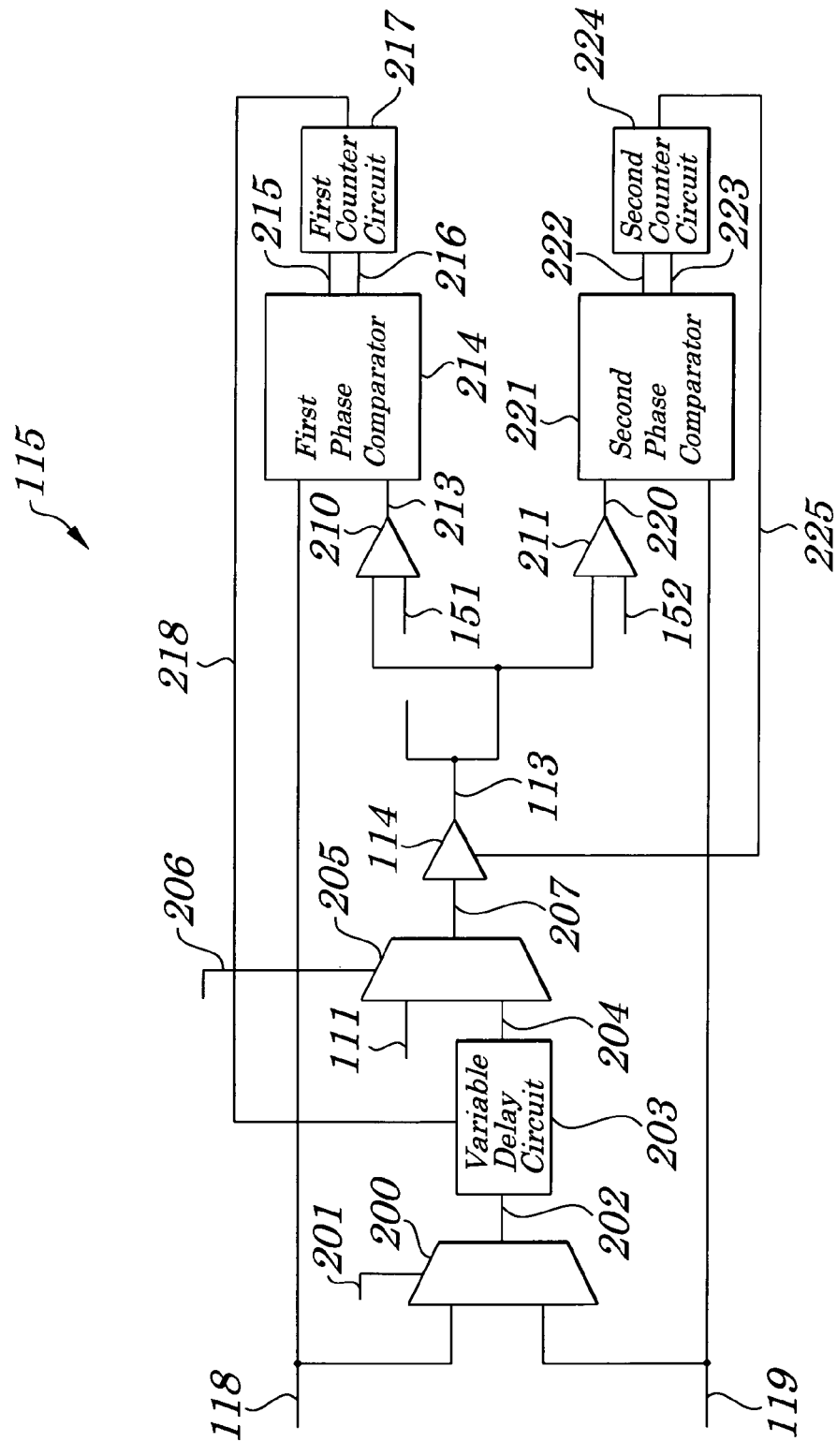
FIG. 3 is a schematic block diagram showing configurations of a slew rate calibrating circuit according to the embodiment of the present invention.

FIG. 3 is a schematic block diagram concretely showing configurations of the slew rate calibrating circuit 115. The slew rate calibrating circuit 115 has a clock selector 200 to input the first clock 118 and the second clock 119 shown in FIG. 1. The clock selector 200 receives a clock selector control signal 201 supplied from a clock selecting circuit (not shown) to select either of the first clock 118 or the second clock 119 and outputs the selected clock as a selected signal. That is, switching between the delay time adjusting mode and slew rate adjusting mode is performed by the clock selector control signal 201. A variable delay circuit 203 is a circuit to receive the selected signal 202 to adjust a delay time to be variable and to transfer the adjusted signal, as a delay circuit output signal 204, to the output buffer 114.

On an input side of the output butter 114 is placed a buffer input-side selector 205. The buffer input-side selector 205 receives a buffer input-side selector control signal 206 to be fed from a buffer input selecting circuit (not shown). The buffer input-side selector 205 selects either of the delay circuit output signal 204 or a data signal 111 to be transferred from the first logic circuit 104 shown in FIG. 1 and transfers the selected signal, as a buffer input signal 207, to the output buffer 114. That is, the buffer input-side selector 205 is connected to the first logic circuit 104 when the output buffer 114 is to be used for transfer of data to the second LSI 102 shown in FIG. 1 and is connected to the variable delay circuit 203 when a slew rate is to be adjusted. The transmission path outgoing signal 113 output from the output buffer 114 is branched and one of the branched signals is to be transmitted to the transmission path 103 shown in FIG. 1 and the other of the branched signals is transferred to a first differential buffer 210 and a second differential buffer 211 mounted in the slew rate calibrating circuit 115.

The first differential buffer 210 receives the first reference voltage 151 described in FIG. 2 and serves as a circuit to output a first differential buffer output signal 213 having a rectangular waveform which rises in a time section during which the transmission path outgoing signal 113 is at the same level as the first reference voltage 151 or exceeds the first reference voltage 151. That is, the rise of the first differential buffer output signal 213 indicates time when the transmission path outgoing signal 113, at the time of rising, reaches the first reference voltage 151.

As described by referring to FIG. 2, in the delay time adjusting mode, a period of time between time of rising of the original first clock 118 and time required for the transmission path outgoing signal 113 to reach the first reference voltage 151 is made to coincide with the period $T_1$ of the first clock 118. This can be achieved by making the above period of time coincide with the period $T_1$ in a manner in which the original first clock 118 and the first differential buffer output signal 213 are, by one period, out of phase with each other.

A first phase comparator 214 receives the first differential buffer output signal 213 and the first clock 118 and outputs a first count-up signal 215 or a first count-down signal 216 according to a direction of a time lag of rising of these two signals. A first counter circuit 217 increases or decreases a count value depending on an output of the first count-up signal 215 or the first count-down signal 216. Then, the first phase comparator 214 outputs a delay time control signal to control a delay time of the variable delay circuit 203 according to a count value magnitude.

That is, if a phase of, for example, the first differential buffer output signal 213 is advanced, the first count-up signal 215 is output and both a count value of the first counter circuit 217 and a value of a delay time control signal 218 increase. As a result, a delay time of the variable delay circuit 203 increases and a phase of the first differential buffer output signal 213 comes near a phase of the first clock 118. On the contrary, if a phase of the first differential buffer output signal 213 is delayed, the first count-down signal 216 is output and both a count value of the first counter circuit 217 and a value of the delay time control signal 218 decrease. As a result, a delay time of the variable delay circuit 203 decreases and a phase of the first differential buffer output signal 213 comes near a phase of the first clock 118. In the slew rate adjusting mode, a count value of the first counter circuit 217 is fixed and a delay time of the variable delay circuit 203 is also fixed.

The second differential buffer 211 receives the second reference voltage 152 described in FIG. 2 and serves as a circuit to output a second differential buffer output signal 220 having a rectangular waveform which rises in a time section during which the transmission path outgoing signal 113 is at the same level as the second reference voltage 152 or exceeds the second reference voltage 152. That is, the rise of the second differential buffer output signal 220 indicates time when the transmission path outgoing signal 113, at the time of rising, reaches the second reference voltage 152.

As described by referring to FIG. 2, in the slew rate adjusting mode, a period of time between time of rising of the original second clock 119 and time required for the transmission path outgoing signal 113 to reach the second reference voltage 152 is made to coincide with the period $(T_1+\Delta T)$ of the second clock 119. This can be achieved by making the above period of time coincide with the period $(T_1+\Delta T)$ in a manner in which the original second clock 119 and the second differential buffer output signal 220 are, by one period, out of phase with each other.

A second phase comparator 221 receives the second differential buffer output signal 220 and the second clock 119 and outputs a second count-up signal 222 or a second count-down signal 223 according to a direction of a time lag of rising of these two signals. A second counter circuit 224 increases or decreases a count value depending on an output of the second count-up signal 222 or the second count-down signal 223. Then, the second counter circuit 224 outputs a slew rate calibrating signal 225 to increase or decrease a value of the above-described specified parameter of the output buffer 114 according to a count value magnitude.

That is, if a phase of the second differential buffer output signal 220 is advanced, a second count-up signal 222 is output and both a count value of the second counter circuit 224 and a value of the slew rate calibrating signal 225 increase. As a result, a value of a specified parameter of the output buffer 114 increases. A slew rate of the output buffer 114 decreases more as the value of the parameter increases more. As a consequence of this, a slew rate of the output buffer 114 decreases and a time required for the transmission path outgoing signal 113 to reach the second reference voltage 152 is delayed, which causes a phase of the second differential buffer output signal 220 to come near a phase of the second clock 119. In the delay time adjusting mode, a count value of the second counter circuit 224 and a slew rate of the output buffer 114 are fixed.

Hereinafter, a state of a signal occurring when a slew rate of the output buffer is lower than its target value, when the slew rate of the output buffer is higher than the target value, and when the slew rate of the output buffer coincides with the target value, respectively, is described in order. For simplification of description, a delay time occurring inside of the output buffer 114 is neglected since the delay time is considered to be contained in the delay time occurring in the variable delay circuit 203. Moreover, a delay time occurring inside of each of the first differential buffer 210 and the second differential buffer 211, since the delay time is negligibly short compared with the delay time occurring in the variable delay circuit 203 and/or the output buffer 114, is neglected.

At the time of the slew rate adjustment of the output buffer 114, as described above, selection by the buffer input-side selector 205 is switched so that the variable delay circuit 203 is connected to the output buffer 114. With this state maintained, the above-mentioned delay time adjusting and slew rate adjusting operations are performed.

Figure 4:
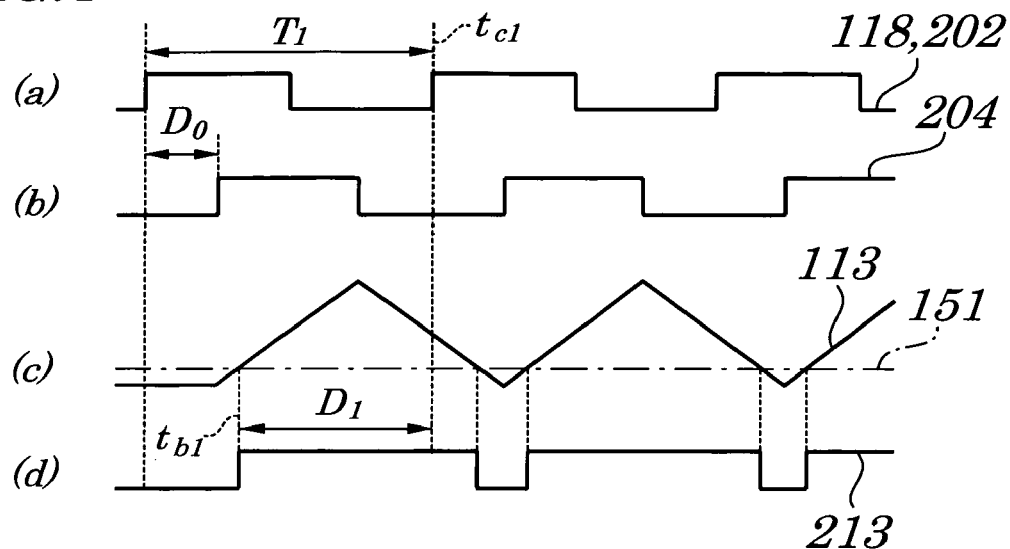
FIG. 4 is a diagram showing waveforms of signals output by each component of the slew rate calibrating circuit before a delay time adjusting operation is performed when a slew rate of an output buffer is lower than a target value according to the embodiment of the present invention.

FIG. 4 is a diagram showing waveforms of signals output by each component of the slew rate calibrating circuit before the delay time adjusting operation is performed when a slew rate of the output buffer is lower than its target value according to the embodiment of the present invention. In FIG. 4, a change of a level of each signal is represented on a time axis. Descriptions are made also by referring to FIG. 3. The first clock 118 shown in (a) of FIG. 4 is a clock having a period $T_1$. When a slew rate of the output buffer 114 is adjusted, the clock selector 200 first transfers the first clock 118 as a selected signal 202 to the variable delay circuit 203. Whether the clock selector 200 selects either of the first clock 118 or second clock 119 depends on, for example, whether the clock selector control signal 201 is "High" or "Low". The variable delay circuit 203, at this time point, delays the selected signal 202 by an initial delay time $D_0$ corresponding to the delay time control signal 218 to be fed from the first counter circuit 217 and transfers a delay circuit output signal 204 shown by (b) of FIG. 5 to the output buffer 114.

The output buffer 114 outputs the transmission path outgoing signal 113 according to the delay circuit output signal 204, however, the transmission path outgoing signal 113 cannot follow a voltage change corresponding to a rising edge and trailing edge of the delay circuit output signal 204, as described above, and changes as a signal with a waveform having a slope defined within a range of the slew rate having been set at that time point. Here, since the slew rate of the output buffer 114 is lower than its target value, the transmission path outgoing signal 113 changes in a non-steep manner compared with the waveform shown in FIG. 2 and comes to have the waveform shown in (c) of FIG. 4.

The first differential buffer 210 outputs a first differential buffer output signal 213 which rises in a time section during which a voltage of the transmission path outgoing signal 113 is at the same level as the first reference voltage 151 or exceeds the first reference voltage 151 (see (d) of FIG. 4) and transfers the signal to the first phase comparator 214. That is, the time $t_{b1}$ when the first differential buffer output signal 213 rises is the time when the voltage of the transmission path outgoing signal 113 reaches the first reference voltage 151. The first phase comparator 214 detects a direction of a shift on a time axis between the time $t_{b1}$ when the first differential buffer output signal 213 rises and a time $t_{c1}$ of rising being subsequent to corresponding rising of the first clock 118 used as a basic original clock. In the example, the detection indicates that a phase of the first differential buffer output signal 213 is advanced by a period of time $D_1$ only.

Then, in order to make the time $t_{b1}$, when the first differential buffer output signal 213 rises, coincide with the time $t_{c1}$ when the first clock 118 rises by delaying further the first differential buffer output signal 213, the first differential buffer 210 transfers the first count-up signal 215 shown in FIG. 3 to the first counter circuit 217. This causes a count value of the first counter circuit 217 to be increased. The delay time control signal 218 is an n- ("n" is a natural number) bit signal. The first counter circuit 217 transfers the delay time control signal 218, which has been increased in a manner to correspond to an increase of a count value, to the variable delay circuit 203.

The variable delay circuit 203 increases a delay time in response to the increase of the count value represented by the delay time control signal 218. If a phase of the first differential buffer output signal 213 is delayed, the first differential buffer 210, on the contrary, transfers the first count-down signal 216 shown in FIG. 3 to the first counter circuit 217 to decrease a count value of the first counter circuit 217. In response to the decrease in the count value, a value of the delay time control signal 218 is decreased and the variable delay circuit 203 decreases a delay time. More specifically, the variable delay circuit 203 has n-pieces of delay circuits each having a selector and each bit-signal making up the delay time control signal 218 switches each of the selectors, thus causing an entire delay time to be changed by a change of a passage pattern of each of the delay circuits.

Such an increase or decrease in the delay time as described above is repeated until the delay time control signal is put into a steady state, with the time $t_{b1}$ of rising of the first differential buffer output signal 213 almost coinciding with the time $t_{c1}$ of rising of the first clock 118. As a result, the variable delay circuit 203 is calibrated so that an input signal is delayed by a time obtained by adding a period of time $D_1$ to an initial delay time $D_0$.

Figure 5:
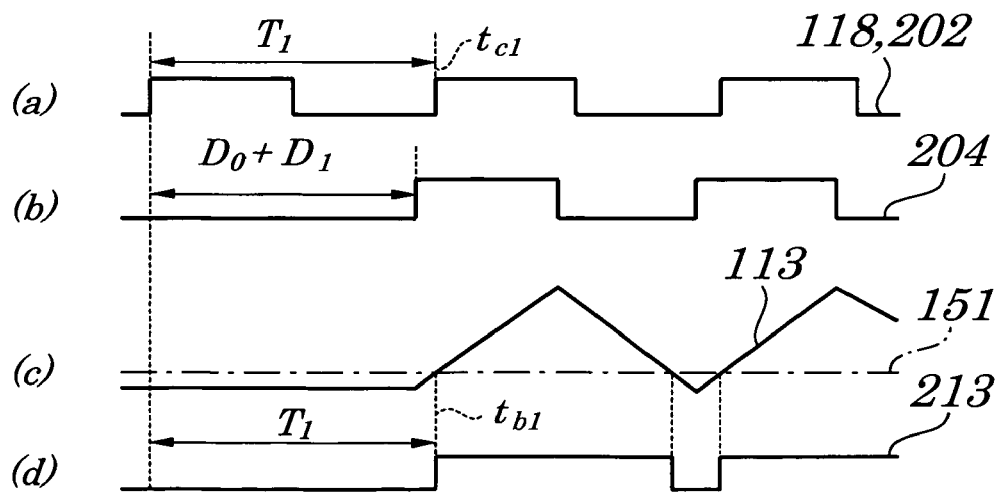
FIG. 5 is a diagram showing waveforms of signals output by each of components making up the slew rate calibrating circuit after a delay time is adjusted according to the embodiment of the present invention.

FIG. 5 is a diagram showing waveforms of signals output by each of components making up the slew rate calibrating circuit after a delay time is adjusted. A delay circuit output signal 204, as shown in (b) of FIG. 5, is delayed, by a time obtained by adding a period of time $D_1$ to an initial delay time $D_0$, from the first clock 118 shown in (a) of FIG. 5. Then, the delay circuit output signal 204 becomes a waveform shown in (c) of FIG. 5 and the time $t_{b1}$ of rising of the first differential buffer output signal 213 coincides with the time $t_{c1}$ of rising of the first clock 118. Then, the clock selector 200 selects the second clock 119 as a selecting clock to be transferred to the variable delay circuit 203 and the operating mode of the slew rate calibrating circuit 115 is changed from a delay time adjusting mode to a slew rate adjusting mode.

Figure 6:
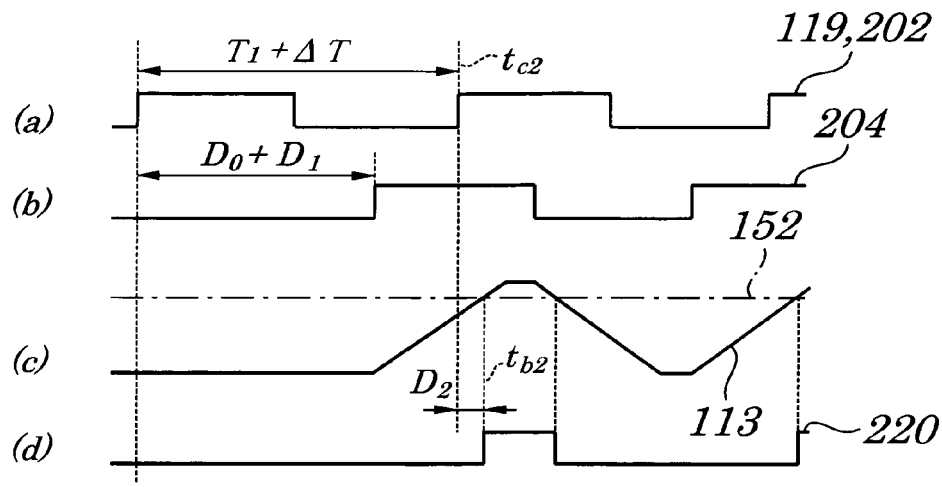
FIG. 6 is a diagram showing waveforms output from each component making up the slew rate after a selection of a clock is switched to a second clock according to the embodiment of the present invention.

FIG. 6 is a diagram showing waveforms output from each component making up the slew rate after the selection of a clock is switched to the second clock 119. The second clock 119, as shown in (a) of FIG. 6, has a period extended by the unit time $\Delta T$, as described in FIG. 2, than the first clock 118. The variable delay circuit 203, since the delay time has been already adjusted as described above, outputs, as in the case of (b) of FIG. 5, the second clock 119 delayed by the time obtained by adding a period of time $D_1$ to the initial delay time $D_0$ as a delay circuit output signal 204 having the waveform shown in (b) of FIG. 6.

The output buffer 114 outputs a transmission path outgoing signal 113 in response to the input delay circuit output signal 204 and slopes of its rising and trailing edges are the same as shown in (c) of FIG. 4 and (c) of FIG. 5. The second differential buffer 211, as in the case of the first differential buffer 210, outputs a second differential output signal 220 shown in (d) of FIG. 4, which rises in a time section during which a voltage of the transmission path outgoing signal 113 is at the same level as the second reference voltage 152 or exceeds the second reference voltage 152 and transfers the second differential buffer output signal 220 to the second phase comparator 221. That is, the time $t_{b2}$ when the second differential buffer output signal 220 rises is the time when the transmission path outgoing signal 113 reaches the second reference voltage 152.

A sum total of the delay time of signals occurring between an input side of the clock selector 200 and an input side of the first phase comparator 214 is adjusted to coincide with a period $T_1$ of the first clock 118 as described above. The first differential buffer output signal 213 to be input to the first phase comparator 214 rises when the transmission path outgoing signal 113 reaches the first reference voltage 151. Moreover, as described above, the delay time of each of the first differential buffer 210 and second differential buffer 211 is negligibly short compared with an entire delay time. Therefore, a sum total of the delay time of signals occurring between the input side of the clock selector 200 and the input side of the second phase comparator 221 is the time obtained by adding time required for a voltage of the transmission path outgoing signal 113 to be changed from the first reference voltage 151 to the second reference voltage to the period $T_1$ of the first clock 118. By making time required for the first reference voltage 151 to be changed to the second reference voltage 152 be the time $\Delta T$, the slew rate of the output buffer 114 can be adjusted to become its target value shown in FIG. 2 and, therefore, by making a sum total of a delay time be equal to the period $(T_1+\Delta T)$ of the second clock 201, the adjustment can be achieved. That is, all that is to be done is to make the time $t_{b1}$ when a voltage of the transmission path outgoing signal 113 reaches the second reference voltage 152 coincide with the time $t_{c2}$ of subsequent rising of the second clock 119.

Here, since the slew rate is lower than the target value, as is apparent from (d) of FIG. 6, the time $t_{b2}$ when a voltage of the transmission path outgoing signal 113 reaches the second reference voltage 152 is delayed by a period of the time $D_2$ than the time $t_{c2}$ when the second clock 119 rises. Then, in order to make the second differential buffer output signal 220 be advanced and to make the time $t_{b2}$ when the signal 220 rises coincide with the time $t_{c2}$ when the second clock 119 rises, the second differential buffer 211 transfers the second count-down signal 223 shown in FIG. 3 to the second counter circuit 224. This causes a count value held by the second counter circuit 224 to decrease. The slew rate calibrating signal 225 is an m-("m" is a natural number) bit signal and the second counter circuit 224 transfers the slew rate calibrating signal 225 having been decreased in response to the decrease of its count value to the output buffer 114.

The output buffer 114 decreases a value of the specified parameter described above in response to the decrease in values of the slew rate calibrating signal 225. The output buffer 114 makes its slew rate the smaller as a value of the parameter becomes the larger and makes its slew rate the larger as the parameter becomes the smaller. Therefore, by the decrease in the value of the parameter, the slew rate increases and a slope of the rising edge of the transmission path outgoing signal 113 becomes steep. Such an increase in a delay time is repeated until the slew rate calibrating signal 225 is put into a steady state, with the time $t_{b2}$ of rising of the second differential buffer output signal 220 almost coinciding with the time $t_{c2}$ of rising of the second clock 119, that is, until the slew rate reaches its target value.

Figure 7:
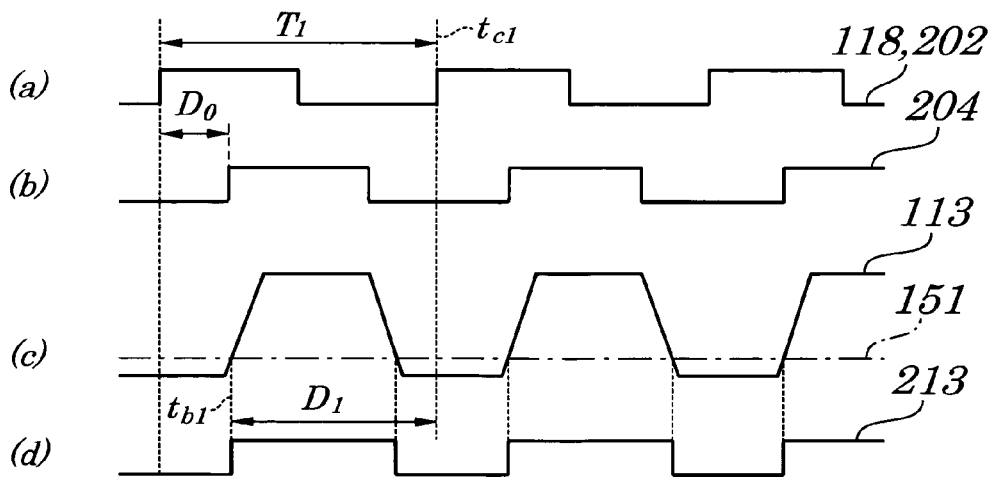
FIG. 7 is a diagram showing waveforms of signals output by each component of the slew rate calibrating circuit before a delay time adjusting operation is performed when a slew rate of the output buffer is higher than a target value according to the embodiment of the present invention.

FIG. 7 is a diagram showing waveforms of signals output by each component of the slew rate calibrating circuit before the delay time adjusting operation is performed when a slew rate of the output buffer is higher than its target value according to the embodiment of the present invention, which corresponds to FIG. 4. The same reference numbers are assigned to the same parts as shown in FIG. 4 and their descriptions are omitted accordingly. Here, since the slew rate of the output buffer 114 is lower than its target value, unlike in the case of FIG. 4, the transmission path outgoing signal 113 changes rapidly compared with the signal having the waveform shown in FIG. 2 and becomes a signal having a waveform shown in (c) of FIG. 7. As a result, the time $t_{b1}$ occurs earlier compared with that shown in FIG. 4 and the time $D_1$ occurring before the time $t_{c1}$ when the first differential buffer output signal 213 shown in (d) of FIG. 7 rises is made longer compared with that shown in FIG. 4. Similarly, the delay time of the variable delay circuit 203 is adjusted so that the time $t_{b1}$ of rising of the first differential buffer output signal 213 coincides with the time $t_{c1}$ of rising of the first clock 118.

Figure 8:
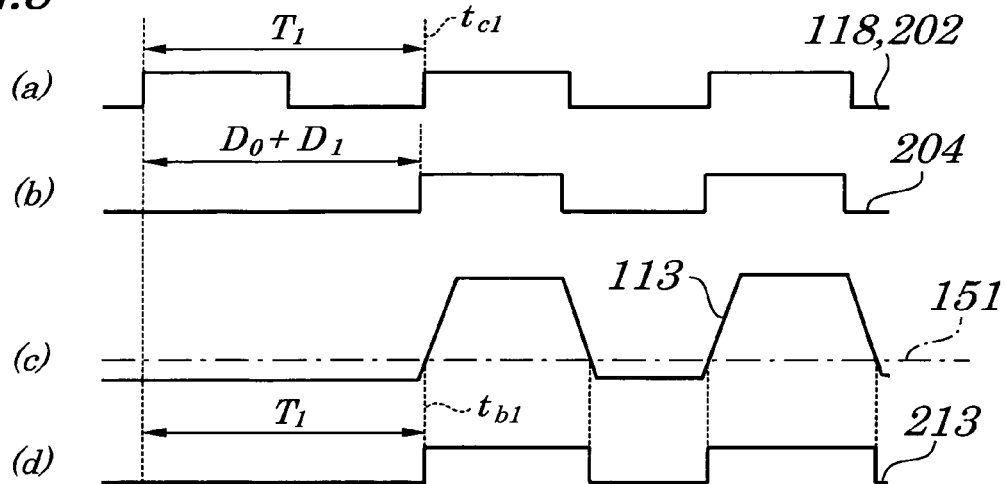
FIG. 8 is a diagram showing waveforms of signals output by each of components making up the slew rate calibrating circuit after a delay time is adjusted according to the embodiment of the present invention.

FIG. 8 is a diagram showing waveforms of signals output by each of components making up the slew rate calibrating circuit after a delay time is adjusted as above according to the embodiment. As in the case of FIG. 5, the delay circuit output signal 204 is delayed by a time obtained by adding a time $D_1$ to the initial delay time $D_0$ and the delay circuit output signal 204 comes to have a waveform shown in (c) of FIG. 8. The time $t_{b1}$ when the first differential buffer output signal 213 rises coincides with the time $t_{c1}$ when the first clock 118 rises. Similarly, the routine proceeds to calibrating processing of the slew rate of the output buffer 114.

Figure 9:
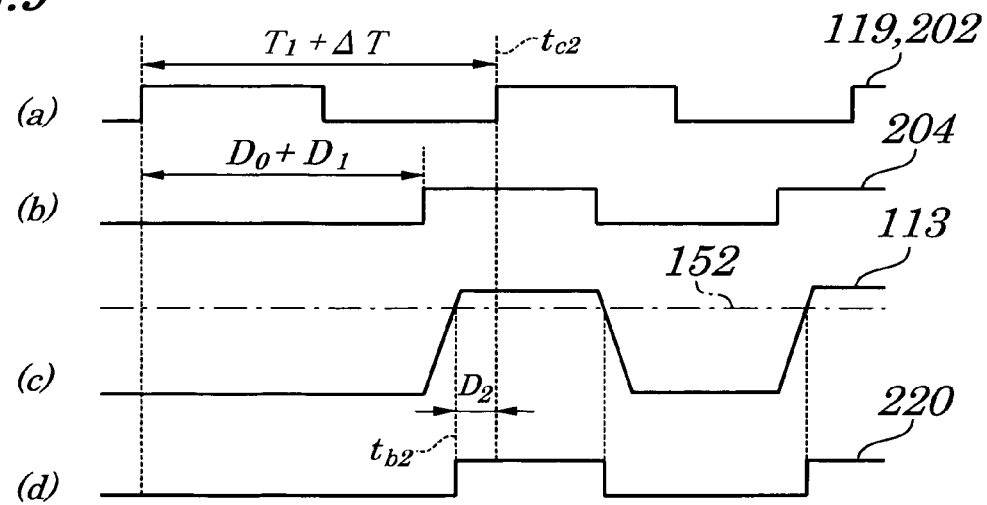
FIG. 9 is a diagram showing waveforms of signals output from each component making up the slew rate calibrating circuit after the selection of the clock is switched to the second clock according to the embodiment of the present invention.

FIG. 9 is a diagram showing waveforms of signals output from each component making up the slew rate calibrating circuit after the selection of a clock is switched to the second clock 119, which corresponds to FIG. 6. Here, since the slew rate is higher than its target value, as apparent from (d) of FIG. 6, the time $t_{b2}$ when the transmission path outgoing signal 113 reaches the reference voltage 152 occurs earlier by the time $D_2$ than the time $T_{c2}$ when the second clock 119 rises. Then, in order to make the time $t_{b2}$ when the second differential buffer output signal 220 rises coincide with the time $t_{c2}$ when the second clock 119 rises by delaying the second differential buffer output signal 220, the second differential buffer 211 transfers the second count-up signal 222 shown in FIG. 3 to the second counter circuit 224. This causes a count value held by the second counter circuit 224 to increase. The second counter circuit 224 transfers a slew rate calibrating signal whose value has been increased in response to the increase of the count value to the output buffer 114.

The output buffer 114 makes its slew rate smaller when a value of the specified parameter is larger. Therefore, in response to the increase in the value of the slew rate calibrating signal 225, a slew rate of the output buffer 114 decreases and a slope of the rising edge of the transmission path outgoing signal 113 becomes less steep. Such a decrease in a slew rate as described above is repeated until the slew rate calibrating signal 225 is put into a steady state, with the time $t_{b2}$ of rising of the second differential buffer output signal 220 almost coinciding with the time $t_{c2}$ of rising of the second clock 119, that is, until the slew rate reaches its target value.

Moreover, by the change in a slew rate of the output buffer 114, the time $t_{b1}$ when the first differential buffer output signal 213 rises is also changed, however, the change is small compared with the change in the time $t_{b2}$ when the second differential buffer output signal 220 rises. Therefore, accuracy of calibration of the slew rate is not affected greatly. Moreover, the accuracy of calibration of the slew rate can be enhanced by performing, for example, a delay time adjusting mode operation and a slew rate adjusting mode alternately specified number of times to make both the operations converge.

Figure 10:
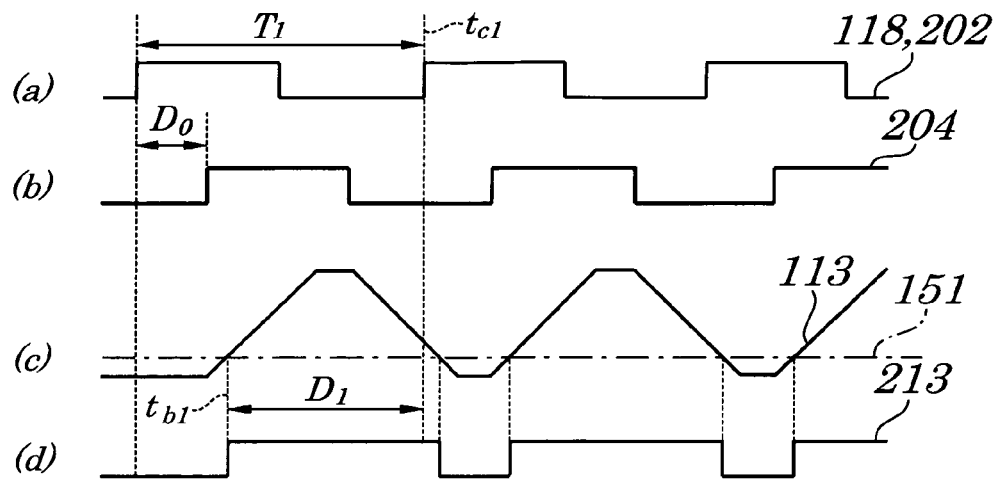
FIG. 10 is a diagram showing waveforms of signals output by each component of the slew rate calibrating circuit before the delay time adjusting operation is performed when a slew rate of the output buffer almost coincides with a target value before a delay time calibration according to the embodiment of the present invention.

FIG. 10 is a diagram showing waveforms of signals output by each component of the slew rate calibrating circuit before the delay time adjusting operation is performed when a slew rate of the output buffer almost coincides with its target value before the delay time calibration according to the embodiment, which corresponds to FIG. 4 and FIG. 7. Here, since the slew rate of the output buffer 114 almost coincides with its target value, a slope of the rising edge of the transmission path outgoing signal 113 is the same as that shown in FIG. 2 and a waveform of the transmission path outgoing signal 113 becomes the same as that shown in (c) of FIG. 10. Similarly, a delay time of the variable delay circuit 203 is calibrated so that the time $t_{b1}$ when the first differential buffer output signal 213 rises coincides with the time $t_{c1}$ when the first clock 118 rises.

Figure 11:
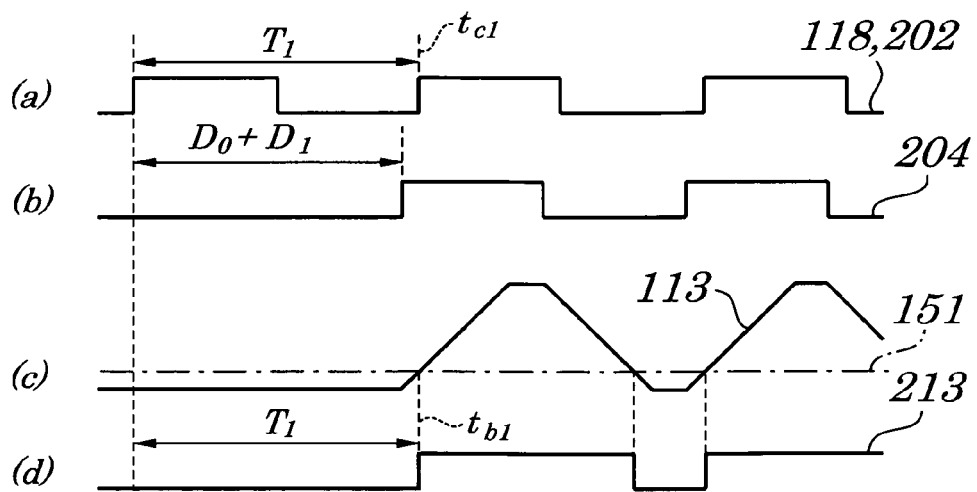
FIG. 11 is a diagram showing waveforms of signals output by each component making up the slew rate calibrating circuit after a delay time is adjusted according to the embodiment of the present invention.

FIG. 11 is a diagram showing waveforms of signals output by each component making up the slew rate calibrating circuit after the delay time is adjusted as described above, which corresponds to FIG. 5 and FIG. 8. As in the case of FIG. 5 and FIG. 8, the delay circuit output signal 204 shown in (b) of FIG. 11 is delayed by the time obtained by adding the time $D_1$ to the initial delay time $D_0$ and a waveform of the delay circuit output signal 204 becomes that shown in (c) of FIG. 11. Thus, the time $t_{b1}$ when the first differential buffer output signal 213 rises coincides with the time $t_{c1}$ when the first clock 118 rises. Similarly, the routine proceeds to the calibration of the slew rate of the output buffer 114.

Figure 12:
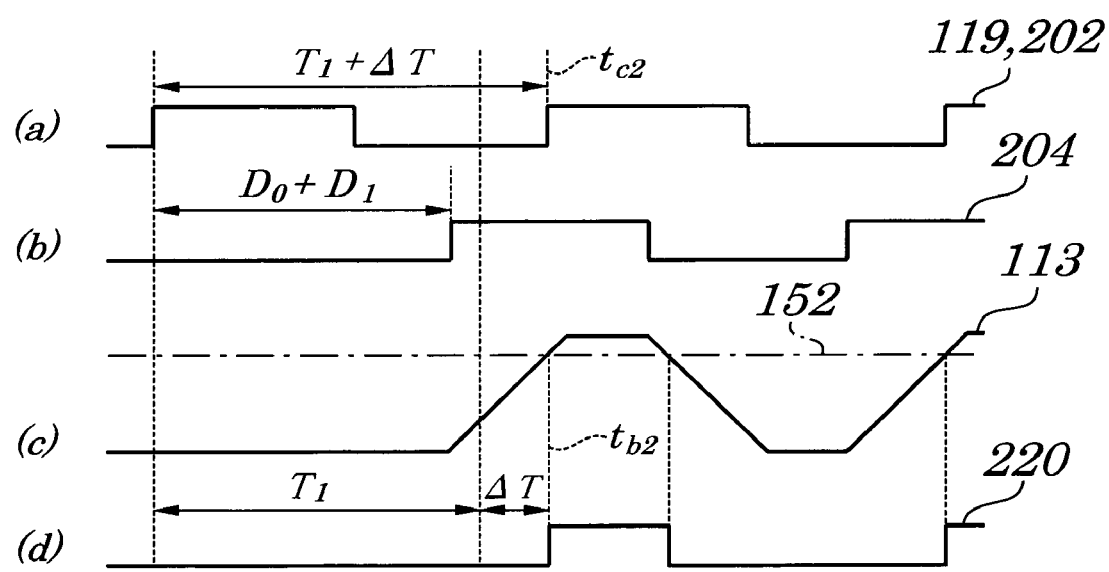
FIG. 12 is a diagram showing waveforms output from each component making up the slew rate calibrating circuit after the selection of the clock is switched to the second clock according to the embodiment of the present invention.

FIG. 12 is a diagram showing waveforms output from each component making up the slew rate calibrating circuit after the selection of a clock is switched to the second clock 119, which corresponds to FIG. 6 and FIG. 9. As described above, calibration is performed so that a period of time between the time of rising of the selected signal 202 and the time $t_{b1}$ when the transmission path outgoing signal 113 reaches the first reference voltage 151 is made to coincide with the period $T_1$ of the first clock 118. Here, a period of time between the time $t_{b1}$ when the transmission path outgoing signal 113 reaches the reference voltage 151 and the time $t_{b2}$ when the transmission path outgoing signal 113 reaches the reference voltage 152 is approximately equal to the unit time $\Delta T$. Therefore, the time $t_{b2}$ when the transmission path outgoing signal 113 reaches the second reference voltage 152, as shown in (d) of FIG. 12, coincides approximately with the time deviated only by the time $(T_1+\Delta T)$ from the rising of the original second clock 119, that is, with the time $t_{c2}$ of subsequent rising of the second clock 119. Thus, it is made possible to make a slew rate of the output buffer 114 coincide with its target value with high accuracy.

When the calibration of a slew rate is complete, the buffer input-side selector 205 switches a selected signal and the output buffer 114 is disconnected from the variable delay circuit 203 and is connected to the first logic circuit 104 shown in FIG. 1.

As described above, according to the slew rate calibrating circuit of the embodiment, two clocks each making a difference in a period so as to correspond to a target value of a slew rate of the output buffer and two reference voltages to correspond to the two clocks are provided. Then, a signal is delayed in a manner in which the time when rising of a buffer output signal by the first clock reaches the first reference voltage is made to coincide with the time when the first clock rises. This makes it possible to compare a difference between the two clocks with the time required when rising of the buffer output signal reaches the second reference voltage after having reached the first reference voltage. Then, by changing a slew rate of the output buffer to achieve coincidence among them, it is possible to make a slew rate coincide with its target. Since a unit time to be applied to setting of a slew rate can be set by using frequencies of the two clocks, more accurate calibration of the slew rate is made possible. Therefore, reliable adjustment of a slew rate of an output signal to be fed to a transmission path can be made so that the slew rate becomes a proper value and the suppression of noises and delay time occurring before an output signal reaches a specified voltage can be effectively achieved.

Moreover, when a target value of a slew rate is set, it is possible to make a frequency of one clock be variable and a frequency of another clock and two reference voltages be fixed or to make one reference voltage variable and another reference voltage and frequencies of two clocks be fixed. On the contrary, the frequencies of two clocks may be fixed while the two voltages may be set arbitrarily. Or, by making more parameters variable, freedom of setting a target value may be extended.

Also, the two phase comparators may be used not for detecting a direction of a phase difference but for detecting whether or not a lag in the time of rising of the two signals falls within a specified range. In this case, for example, when the slew rate calibration is started, a count value of the first counter circuit 210 needs to be initialized to make the count value sufficiently small so that a sum total of the delay time of a signal occurring between an input side of the clock selector 200 and an output side of the first differential buffer 210 is enough small when compared with a period of the first clock 118. In addition, a count value of the second counter circuit 224 needs to be initialized so as to be sufficiently small so that a slew rate of the output buffer 114 is sufficiently large when the slew rate is adjusted. Moreover, a phase difference being smaller than that corresponding to a unit increment of each count value may be neglected.

FIRST MODIFIED EXAMPLE

An example is described in which first and second clocks 118, 119 are supplied by one common clock generator 311 and in which a unit time for adjustment of a slew rate can be set arbitrarily.

Figure 13:
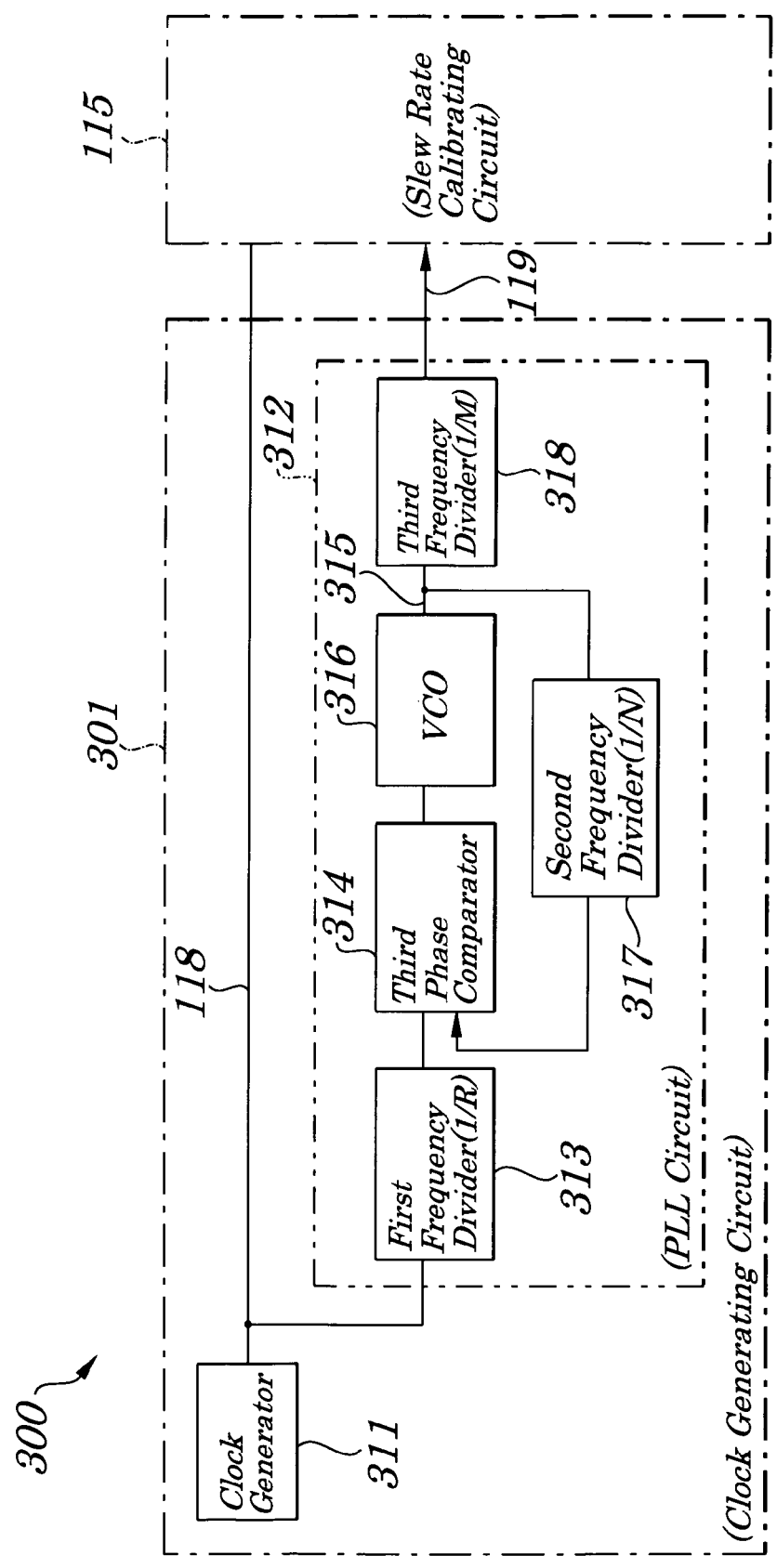
FIG. 13 is a schematic block diagram showing configurations of a slew rate calibrating device using a slew rate calibrating circuit of a first modified example of the present invention.

FIG. 13 is a schematic block diagram showing configurations of a slew rate calibrating device 300 using a slew rate calibrating circuit according to the first modified example of the present invention. The slew rate calibrating device 300 includes the slew rate calibrating circuit 115 described in the above embodiment and a clock generating circuit 301 to generate clocks 118, 119 having two different frequencies and to supply the clocks 118, 119 to the slew rate calibrating circuit 115. The clock generating circuit 301 is placed on the same circuit board as an LSI having the slew rate calibrating circuit 115 mounted. The clock generating circuit 301 has the clock generator 311 to output the first clock 118 and a PLL (Phase-Locked Loop) circuit 312 to output the second clock 119. The first clock 118 is input not only to the slew rate calibrating circuit 115 but also to the PLL circuit 312.

The PLL circuit 312 has a first frequency divider 313 to divide the input first clock 118 into R equal portions and a VCO (Voltage Controlled Oscillator) 316 to output a third clock 315 at a frequency corresponding to a voltage output from the third phase comparator 314. The PLL circuit 312 also has a second frequency divider 317 to divide the third clock 315 into R equal portions and to transfer the divided clock to the third phase comparator 314. That is, the third phase comparator 314 changes a voltage to be output to the VCO 316 according to a phase difference between a signal obtained by dividing the first clock 118 into R equal portions and a signal obtained by dividing the third clock 315 output from the VCO 316 into N equal portions. Phases of these two signals, that is, their frequencies diverge. The PLL circuit 312 also has a third frequency divider 318 to divide the third clock 315 into M equal portions and outputs the divided clock as the second clock 119. Each of the first frequency divider 313, second frequency divider 317, and the third frequency divider 318 is so configured that any frequency dividing ratio can be set arbitrarily.

When each of signals is put into a steady state by the PLL circuit 312 as above, the following equation (1) holds:

$$f_2 = (f_1 \times N)/(R+M) \quad (1)$$

where $f_1$ denotes a frequency of the first clock 118 and $f_2$ denotes a frequency of the second clock 119.

Therefore, by properly setting the first to third frequency dividers 313, 317, and 318 respectively, the frequency $f_1$ of the first clock 118 can be divided or multiplied at an arbitrary ratio and the frequency $f_2$ of the second clock 119 can be arbitrarily set with a high degree of flexibility. This means that a length of the unit time ΔT employed when the target value of the slew rate of an output buffer 114 described in the above embodiment is set can be set arbitrarily.

As described above, according to the first modified example, the PLL circuit generates, by using one clock, another clock having a different frequency and, therefore, a single clock generator is enough, thus making it possible to reduce costs of the system. For example, a unit time can be arbitrarily set by using a clock being used to operate an LSI logic circuit. Moreover, in the modified example, the second clock having a frequency being lower than that of the first clock is generated by using the first clock, however, the first clock may be generated by using the second clock or the first and second clocks may be generated based on an entirely another clock by using two PLL circuits. Furthermore, the PLL circuit or the entire clock generating circuit may be integrally constructed as part of the slew rate calibrating circuit.

SECOND MODIFIED EXAMPLE

An example is described in which a device section to control operations of each circuit portion is provided to enable affective adjustment of a slew rate.

Figure 14:
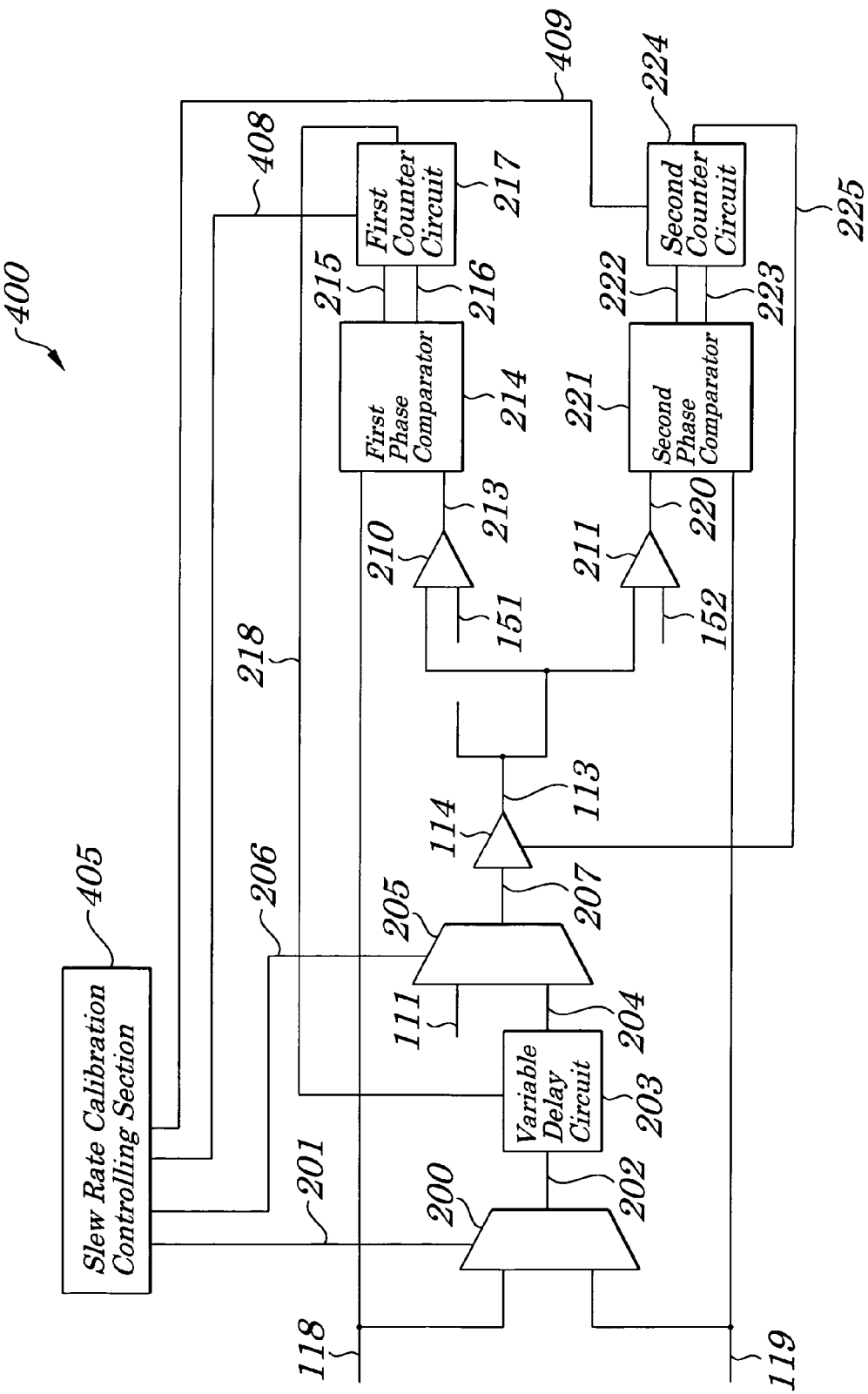
FIG. 14 is a schematic block diagram showing configurations of a slew rate calibrating circuit according to a second modified example.

FIG. 14 is a schematic block diagram showing configurations of a slew rate calibrating circuit 400 according to the second modified example, which corresponds to the embodiment shown in FIG. 3. The same reference numbers are assigned to the same parts as used in FIG. 3 and their descriptions are omitted accordingly. The slew rate calibrating circuit 400 shown in FIG. 4, unlike in the case shown in FIG. 3, has a slew rate calibration controlling section 405 to control an entire operation of the slew rate calibrating circuit 400 which outputs a clock selector control signal 201 and a buffer input-side selector control signal 206. The slew rate calibrating circuit 400 also outputs a first counter value holding instruction signal 408 and a second counter value holding instruction signal 409 to a first counter circuit 217 and a second counter circuit 224 respectively as a signal to hold a counter value retained by each of the first counter circuit 217 and the second counter circuit 224.

The slew rate calibration controlling section 405 is made up of a CPU (Central Processing Unit) (not shown), a storage medium to store control programs to be run by the CPU, and a circuit device (not shown) to output each controlling signal. The slew rate calibration controlling section 405 adjusts a slew rate of an output buffer 114 by outputting each controlling signal at a specified value with proper timing to control operations of each device component being connected thereto.

Figure 15:
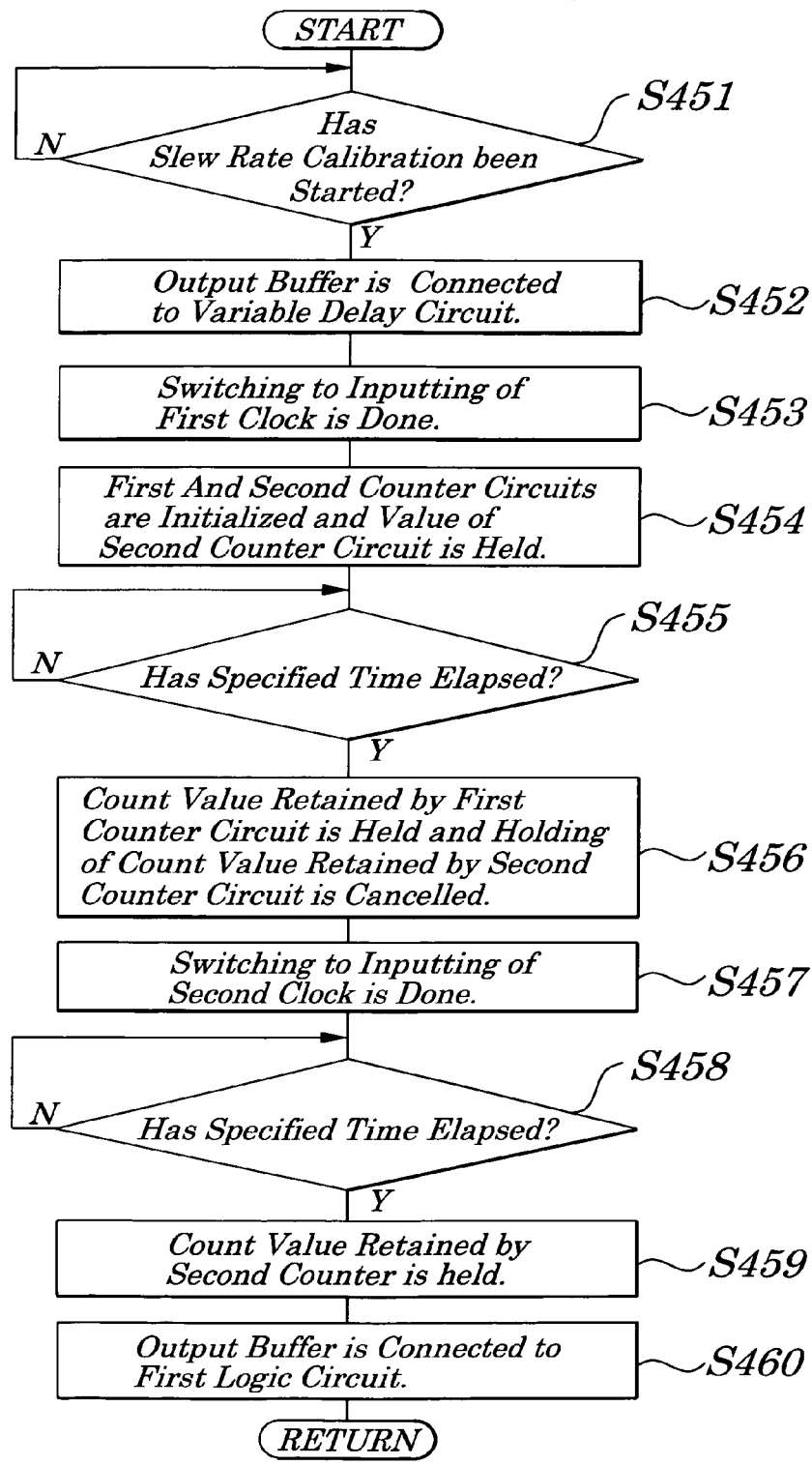
FIG. 15 is a flow chart showing flows of slew rate calibrating control processes to be performed by a slew rate calibration controlling section according to the second modified example.

FIG. 15 is a flow chart showing flows of slew rate calibrating control processes to be performed by the slew rate calibration controlling section 405 of the second modified example. The slew rate calibration controlling section 405 accepts an instruction for starting the slew rate calibration by manipulating a key board (not shown) or by pressing down switches (not shown). When an instruction for starting the slew rate calibration is provided (Step S451: Y), a buffer input-side selector 205 is switched and the output buffer 114 is connected to a variable delay circuit 203 (Step S452). Then, a clock selector 200 is made to input a first clock 118 to the variable delay circuit 203 (Step S453). By this operation, a signal having the same waveform as that of the first clock 118 is input to the output buffer 114 and a signal corresponding to this signal is transferred to a first differential buffer 210 as a transmission path outgoing signal 113.

At this stage, the first counter circuit 217 and second counter circuit 224 are initialized and, in order to temporarily fix a slew rate of the output buffer 114, a counter value retained by the second counter circuit 224 is held (Step S454). Then, as described in the above embodiment, in a direction in which a difference in phase between the first clock 118 and a first differential buffer output signal 213 exactly becomes a period $T_1$ of the first clock 118, a count value retained by the first counter circuit 217 increases or decreases and the calibration of a delay time of the variable delay circuit 203 is achieved.

When, after the start of the calibration, a specified time enough to make the phase difference converge into the period $T_1$ of the first clock 118 elapses (Step S455: Y), in order to fix a delay time of the variable delay circuit 203 occurring at that time, a count value retained by the first counter circuit 217 is made to be held. On the other hand, the holding of the count value of the second counter circuit, which has been performed to calibrate the delay time, is cancelled (Step S456). The clock selector 200 is made to input the second clock 119 to the variable delay circuit 203 (Step S457). By this operation, a signal having the same waveform as that of the first clock 118 is input to the variable delay circuit 203 and a signal corresponding to this signal is transferred to a second differential buffer 211 as the transmission path outgoing signal 113.

By performing the processing from Steps S454 to S456, a sum total of the delay time occurring between an input-side of the clock selector 200 and an input-side of the first phase comparator 214 coincides with the period $T_1$ of the clock 118. Therefore, in order to perform adjustment so that a slew rate of the output buffer 114 becomes the period $T_1$ of the first clock 118, the sum total of the delay time occurring between an input-side of the clock selector 200 and an input-side of the second phase comparator 221 is made to coincide with the period $(T_1+\Delta T)$ of the second clock 119. In a direction in which a difference in phase between the second clock 119 and the second differential buffer output signal 220 exactly becomes the period $(T_1+\Delta T)$ of the second clock 119, a count value retained by the second counter circuit 224 and a value of a specified parameter of the output buffer 114 increase or decrease and the calibration of the delay time of the output buffer 114 is achieved.

When, after the start of the calibration, a specified time enough to make the phase difference converge into the period $(T_1+\Delta T)$ of the second clock 119 elapses (Step S458: Y), in order to fix a value of the specified parameter of the output buffer 114, a count value retained by the second counter circuit 224 is made to be held (Step S459). When a value of the specified parameter of the output buffer 114 is fixed, the slew rate is also fixed and the obtained slew rate is a value resulting from convergence in which the slew rate almost coincides with its target value. Therefore, the slew rate calibration is completed now and the buffer input-side selector 205 is switched to disconnect the output buffer 114 from the variable delay circuit 203 and to connect the output buffer 114 to the first logic circuit 104 (Step S460) and the processing is terminated and an instruction for the slew rate calibration is waited for (Return). Thereafter, the output buffer 114 holds the set slew rate until a value of a specified parameter is changed, that is, until a different slew rate calibrating signal 225 is received. Moreover, with the output buffer being so constructed as to store a value of the specified parameter, after the Step S459, the second counter circuit 224 may be disconnected from the output buffer 114.

Also, as described above, by the adjustment of a slew rate of the output buffer 114, a sum total of the delay time occurring between the input-side of the clock selector 200 and the input-side of the first phase comparator 214 is deviated only slightly from the period $T_1$ of the first clock 118. Therefore, the processing in Steps S453 to S459 may be performed repeatedly the number of times corresponding to a requested level of calibration accuracy. Moreover, the timing with which count values retained by a first counter circuit 217 and the second counter circuit 224 are held may be the time of judging sequentially whether each of the count values converges into a specified value.

As described above, according to the second modified example of the present invention, since the slew rate calibration controlling section used to control, with proper timing, operations of each component making up the slew rate calibrating circuit is provided, which can save user's work of providing an instruction for switching a signal or a like. Moreover, more effective calibration of a slew rate is made possible.

It is apparent that the present invention is not limited to the above embodiment and/or the example, but may be changed and modified without departing from the scope and spirit of the invention. For example, in the above embodiment and in the first and second modified examples, the slew rate calibrating operation is performed directly on the output buffer whose slew rate is to be calibrated, however, other output buffer having the same configurations or same types as the above output buffer whose slew rate is to be calibrated has may be prepared and be connected thereto. In this case, a value of a parameter used to change a slew rate that is set, after calibration, to the output buffer is detected and the same detected value is set to the same parameter of the output buffer whose slew rate is to be actually calibrated.

Moreover, in the above embodiment, the output buffer being used for an output circuit of an LSI or the like is taken as the example; however, it is needless to say that the present invention can be applied to various devices finding correlation between other specified parameter and its own slew rate. In this case, relationship between a direction and an increase or decrease of the second counter circuit 224 may be set in a manner to correspond to relationship between a parameter and an increase or decrease of a slew rate.

What is claimed is:
1. A slew rate calibrating circuit comprising:
a signal processing unit to output an input signal in a manner in which restrictions are put on a change rate of a voltage of the input signal and to be able to adjust a slew rate as a maximum change rate of a voltage of the output signal;
a variable signal delaying unit being connected to an input side of said signal processing unit and to be able to adjust a delay time of a signal to be input to said signal processing unit;
a clock selecting unit to select either of a first clock or a second clock having a period extended by a predetermined unit time than that of the first clock and to supply the selected clock to said variable signal delaying unit;
a first rectangular signal outputting unit to receive a signal to be output from said signal processing unit and to invert logic of the signal every time a high-low relationship between a voltage of said signal to be output from said signal processing unit and a first predetermined reference voltage is reversed and to output a first rectangular signal having a rectangular waveform;
a delay time setting unit to compare, in a time section during which said clock selecting unit selects the first clock, a first time lag, one by one, between a rising edge or falling edge of a waveform of the first clock and a rising edge or falling edge of the first rectangular signal to be output from said first rectangular signal outputting unit in a manner to respond to a corresponding rising edge or falling edge of another first clock existing one period before the rising edge or falling edge of the waveform of the first clock and to set a specified delay time to said variable signal delaying unit, the specified delay time being capable of canceling out the first time lag;
a second rectangular signal outputting unit to receive a signal to be output from said signal processing unit and to invert logic of the signal every time a high-low relationship between a voltage of the signal to be output from said signal processing unit and a second predetermined reference voltage being different from that of said first reference voltage is reversed and to output a second rectangular signal; and
a slew rate setting unit to compare, in a time section during which said clock selecting unit selects the second clock, a second time lag, one by one, between a rising edge or falling edge of the second clock and a rising edge or falling edge of the second rectangular signal to be output from said second rectangular signal outputting unit in a manner to respond to a corresponding rising edge or falling edge of another second clock existing one period before rising edge or falling edge of the second clock and to set a specified slew rate to said signal processing unit, such that the second time lag disappears.

2. The slew rate calibrating circuit according to claim 1, wherein said delay time setting unit comprises:
a first count value holding unit to hold a first count value to be used to set the specified delay time to said variable signal delaying unit;
a first signal comparing unit to detect, in a time section during which said clock selecting unit selects the first clock, a direction of the first time lag, one by one, between the rising edge or falling edge of the first clock and the rising edge or falling edge of the first rectangular signal to be output from said first rectangular signal outputting unit in a manner to respond to the corresponding rising edge or falling edge of the other first clock existing one period before the rising edge or falling edge of the first clock;
a first count value increasing/decreasing unit to increase or decrease, by every one count, a first count value held by said first count value holding unit, every time said first signal comparing unit detects a direction of the first time lag, according to the direction of the first time lag; and
a delay time adjusting unit to adjust the specified delay time set by said variable signal delaying unit so that the specified delay time has a length corresponding to a first count value held by said first count value holding unit.

3. The slew rate calibrating circuit according to claim 1, wherein said slew rate setting unit comprises:
   a second count value holding unit to hold a second count value to be used to set a slew rate to said signal processing unit;
   a second signal comparing unit to detect, in a time section during which said clock selecting unit selects the first clock, a direction of the second time lag, one by one, between the rising edge or falling edge of the second clock and the rising edge or falling edge of the second rectangular signal to be output from said second rectangular signal outputting unit in a manner to respond to the corresponding rising edge or falling edge of the other second clock existing one period before the rising edge or falling edge of the second clock;
   a second count value increasing/decreasing unit to increase or decrease, by every one count, a first count value held by said first count value holding unit, every time said second signal comparing unit detects the direction of the second time lag, according to the direction of the second time lag; and
   a slew rate adjusting unit to adjust a slew rate set by said signal processing unit so that said slew rate has a value corresponding to a second count value held by said second count value holding unit.

4. The slew rate calibrating circuit according to claim 1, comprising a period difference setting unit to arbitrarily set said unit time being a difference in period between the first clock and the second clock.

5. The slew rate calibrating circuit according to claim 1, further comprising:
   a first clock generating unit to generate a clock having a predetermined period; and
   a second clock generating unit to receive a clock generated by said first clock generating unit and to convert the input clock into a clock having an arbitrary period;
   wherein the first clock is one out of two signals to be output from said first generating unit and said second generating unit, which has a shorter period, and the second clock is another one out of two signals.

6. The slew rate calibrating circuit according to claim 1, further comprising:
   a calibration start request accepting unit to accept a request asking said signal processing unit to start calibration of a slew rate;
   a first clock supply instructing unit to make said clock selecting unit start supplying of the first clock to said signal processing unit when said calibration start request accepting unit accepts said request for a start of said calibration;
   a second clock supply instructing unit to make said clock selecting unit switch selection of the clock to the first clock when said delay time setting unit starts setting of the first time lag and a first predetermined time elapses; and
   a device disconnecting unit to stop both supply of a clock to said signal processing unit and acquisition of a signal to be output from said signal processing unit when said slew rate setting unit starts setting of said slew rate and a second predetermined time elapses.

7. A slew rate calibrating method comprising:
   a first clock supply starting step to start supplying of a first clock to a signal processing unit which outputs an input signal in a manner in which restrictions are put on a change rate of a voltage of the first clock and is able to adjust a slew rate as a maximum change rate of a voltage of the output signal through a variable delaying unit which adjusts a specified delay time of a signal to be input to said signal processing unit so that the specified delay time is made variable;
   a first rectangular signal outputting step to invert logic of a signal every time a high-low relationship between a voltage of a signal to be output from said signal processing unit and a first predetermined first reference voltage is reversed when said supplying of the first clock to said signal processing unit is started in said first clock supply starting step and to output a first rectangular signal having a rectangular waveform;
   a first signal comparing step to detect a direction of a first time lag, one by one, between a rising edge or falling edge of a waveform of the first clock and a rising edge or falling edge of the first rectangular signal to be output from said first rectangular signal outputting unit in a manner to respond to a corresponding rising edge or falling edge of another first clock existing one period before the rising edge or falling edge of the waveform of the first clock;
   a delay time setting step to increase the specified delay time set by said variable delaying unit when a lead in the rising edge or falling edge of the first rectangular signal is detected in said first signal comparing step and to decrease the specified delay time set by said variable delaying unit when a lag in the rising edge or falling edge of the first rectangular signal is detected in said first signal comparing step and to make the rising edge or falling edge of the waveform of the first clock and the rising edge or falling edge of the first rectangular signal coincide with each other;
   a delay time fixing step to fix, when the rising edge or falling edge of the waveform of the first clock and the rising edge or falling edge of the first rectangular signal are made to coincide with each other in the specified delay time setting step, the specified delay time set by said variable delaying unit occurring at time of the coincidence is fixed;
   a second clock supplying step to start, when the specified delay time set by said variable delaying unit is fixed in said delay time fixing step, supplying of a second clock having a period being longer by a predetermined unit time than that of the first clock, instead of the first clock, through said variable delaying unit to said signal processing unit;
   a second rectangular signal outputting step to invert, when supplying of the first clock to said signal processing unit is started in said second clock supplying step, logic of a signal every time a high-low relationship between a voltage of a signal to be output from said signal processing unit and a second predetermined reference voltage being different from the first reference voltage is reversed when said supplying of the first clock to said signal processing unit is started in said first clock supply starting step and to output a second rectangular signal;
   a second signal comparing step to detect a direction of a second time lag, one by one, between a rising edge or falling edge of the second clock and a rising edge or falling edge of the second rectangular signal to be output in said second signal comparing step in a manner to respond to a corresponding rising edge or falling edge of another second clock existing one period before the rising edge or falling edge of the wave form of the second clock;

a slew rate setting step to decrease the slew rate set by said signal processing unit when a lead in the rising edge or falling edge of the second rectangular signal is detected in said second signal comparing step, and to increase the slew rate set by said signal processing unit when a lag in the rising edge or falling edge of the second rectangular signal is detected in said second signal comparing step and to make the rising edge or falling edge of the second clock and the rising edge or falling edge of the second rectangular signal coincide with each other; and a slew rate fixing step to fix, when the rising edge or falling edge of the second clock and the rising edge or falling edge of the second rectangular signal are made to coincide with each other in said slew rate setting step, said slew rate occurring at the time of the coincidence is fixed.

8. A slew rate calibrating circuit comprising:

a signal processing means to output an input signal in a manner in which restrictions are put on a change rate of a voltage of the input signal and to be able to adjust a slew rate as a maximum change rate of a voltage of the output signal;

a variable signal delaying means being connected to an input side of said signal processing means and to be able to adjust a delay time of a signal to be input to said signal processing means;

a clock selecting means to select either of a first clock or a second clock having a period extended by a predetermined means time than that of the first clock and to supply the selected clock to said variable signal delaying means;

a first rectangular signal outputting means to receive a signal to be output from said signal processing means and to invert logic of the signal every time a high-low relationship between a voltage of said signal to be output from said signal processing means and a first predetermined reference voltage is reversed and to output a first rectangular signal having a rectangular waveform;

a delay time setting means to compare, in a time section during which said clock selecting means selects the first clock, a first time lag, one by one, between a rising edge or falling edge of a waveform of the first clock and a rising edge or falling edge of the first rectangular signal to be output from said first rectangular signal outputting means in a manner to respond to a corresponding rising edge or falling edge of another first clock existing one period before the rising edge or falling edge of the waveform of the first clock and to set a specified delay time to said variable signal delaying means, the specified delay time being capable of canceling out the first time lag;

a second rectangular signal outputting means to receive a signal to be output from said signal processing means and to invert logic of the signal every time a high-low relationship between a voltage of the signal to be output from said signal processing means and a second predetermined reference voltage being different from that of said first reference voltage is reversed and to output a second rectangular signal; and a slew rate setting means to compare, in a time section during which said clock selecting means selects the second clock, a second time lag, one by one, between a rising edge or falling edge of the second clock and a rising edge or falling edge of the second rectangular signal to be output from said second rectangular signal outputting means in a manner to respond to a corresponding rising edge or falling edge of another second clock existing one period before rising edge or falling edge of the second clock and to set a specified slew rate to said signal processing means, such that the second time lag disappears.

9. The slew rate calibrating circuit according to claim 8, wherein said delay time setting means comprises:

a first count value holding means to hold a first count value to be used to set the specified delay time to said variable signal delaying means;

a first signal comparing means to detect, in a time section during which said clock selecting means selects the first clock, a direction of the first time lag, one by one, between the rising edge or falling edge of the first clock and the rising edge or falling edge of the first rectangular signal to be output from said first rectangular signal outputting means in a manner to respond to the corresponding rising edge or falling edge of the other first clock existing one period before the rising edge or falling edge of the first clock;

a first count value increasing/decreasing means to increase or decrease, by every one count, a first count value held by said first count value holding means, every time said first signal comparing means detects a direction of the first time lag, according to the direction of the first time lag; and a delay time adjusting means to adjust the specified delay time set by said variable signal delaying means so that the specified delay time has a length corresponding to a first count value held by said first count value holding means.

10. The slew rate calibrating circuit according to claim 8, wherein said slew rate setting means comprises:

a second count value holding means to hold a second count value to be used to set a slew rate to said signal processing means;

a second signal comparing means to detect, in a time section during which said clock selecting means selects the first clock, a direction of the second time lag, one by one, between the rising edge or falling edge of the second clock and the rising edge or falling edge of the second rectangular signal to be output from said second rectangular signal outputting means in a manner to respond to the corresponding rising edge or falling edge of the other second clock existing one period before the rising edge or falling edge of the second clock;

a second count value increasing/decreasing means to increase or decrease, by every one count, a first count value held by said first count value holding means, every time said second signal comparing means detects the direction of the second time lag, according to the direction of the second time lag; and a slew rate adjusting means to adjust a slew rate set by said signal processing means so that said slew rate has a value corresponding to a second count value held by said second count value holding means.

11. The slew rate calibrating circuit according to claim 8, comprising a period difference setting means to arbitrarily set said means time being a difference in period between the first clock and the second clock.

12. The slew rate calibrating circuit according to claim 8, further comprising:

a first clock generating means to generate a clock having a predetermined period; and a second clock generating means to receive a clock generated by said first clock generating means and to convert the input clock into a clock having an arbitrary period;

wherein the first clock is one out of two signals to be output from said first generating means and said second generating means, which has a shorter period, and the second clock is another one out of two signals.

13. The slew rate calibrating circuit according to claim 8, further comprising:

a calibration start request accepting means to accept a request asking said signal processing means to start calibration of a slew rate;

a first clock supply instructing means to make said clock selecting means start supplying of the first clock to said signal processing means when said calibration start request accepting means accepts said request for a start of said calibration;

a second clock supply instructing means to make said clock selecting means switch selection of the clock to the first clock when said delay time setting means starts setting of the first time lag and a first predetermined time elapses; and a device disconnecting means to stop both supply of a clock to said signal processing means and acquisition of a signal to be output from said signal processing means when said slew rate setting means starts setting of said slew rate and a second predetermined time elapses.

* * * * *